United States Patent
Pamulapati et al.

[11] Patent Number: 5,953,362
[45] Date of Patent: Sep. 14, 1999

[54] STRAIN INDUCE CONTROL OF POLARIZATION STATES IN VERTICAL CAVITY SURFACE EMITTING LASERS AND METHOD OF MAKING SAME

[76] Inventors: Jagadeesh Pamulapati, 3250 N St. NW. #2, Washington, D.C. 20007-2838; Paul H. Shen, 13809 Mustang Hill La., N. Potomac, Md. 20878

[21] Appl. No.: 08/990,874
[22] Filed: Dec. 15, 1997
[51] Int. Cl.⁶ ............................. H01S 3/08; H01L 33/00; H01L 21/20
[52] U.S. Cl. ................. 372/96; 372/43; 372/45; 372/46; 372/50; 372/99; 372/106; 257/14; 257/15; 257/18; 257/98; 437/51; 437/129
[58] Field of Search .................. 372/27, 43, 45, 372/46, 50, 92, 96, 99, 106; 257/14, 15, 18, 94, 98; 437/51, 129, 130

[56] References Cited

U.S. PATENT DOCUMENTS

| | | | |
|---|---|---|---|
| 5,198,695 | 3/1993 | Hanes et al. | 257/773 |
| 5,331,654 | 7/1994 | Jewell et al. | 372/45 |
| 5,381,260 | 1/1995 | Ballato et al. | 359/248 |
| 5,412,680 | 5/1995 | Swirhun et al. | 372/45 |
| 5,493,577 | 2/1996 | Choquette et al. | 372/46 |
| 5,539,759 | 7/1996 | Chang-Hasnain et al. | 372/19 |
| 5,574,738 | 11/1996 | Morgan | 372/28 |
| 5,594,751 | 1/1997 | Scott | 372/46 |
| 5,633,886 | 5/1997 | Ramdani et al. | 372/45 |
| 5,706,306 | 1/1998 | Jiang et al. | 372/45 X |
| 5,778,018 | 7/1998 | Yoshikawa et al. | 372/45 |

OTHER PUBLICATIONS

"Vertical–Cavity Surface–Emitting Lasers: . . .", IEEE Journal of Quantum Electronics, vol. 27, No. 6, dated Jun. 1991.

*Primary Examiner*—Brian Healy
*Attorney, Agent, or Firm*—Paul S. Clohan, Jr.; Mark D. Kelly

[57] ABSTRACT

A vertical cavity surface emitting laser is formed by eutectically bonding a laser cavity, defined by an active layer disposed between first and second, stacked mirror assemblies, to a host substrate which has a predetermined anisotropic coefficient of thermal expansion. During the forming process, a uniaxial strain is induced within the laser cavity. With this arrangement, large arrays of vertical cavity surface emitting lasers can be formed with predetermined polarization states that are based on the selected anisotropic host substrate.

17 Claims, 3 Drawing Sheets

STRAIN INDUCE CONTROL OF POLARIZATION STATES IN VERTICAL CAVITY SURFACE EMITTING LASERS AND METHOD OF MAKING SAME

BACKGROUND OF THE INVENTION

1. Field of the Invention

The present invention pertains to the art of vertical cavity surface emitting lasers (VCSEL) and, more particularly, to vertical cavity surface emitting lasers that emit optical radiation having controlled polarization states.

2. Discussion of the Prior Art

It is widely known in the art to use semiconductor lasers in various applications such as image scanning and recognition systems, optical communications and laser disc players. As is well known in the art, a typical semiconductor laser is formed by placing two parallel mirror stacks on either side of an active region to form a laser cavity. Usually a semiconductor P-N or P-I-N junction is formed about the active region. When electrical current is provided across the junction, electrons combine with holes in the active layer to generate radiation which is reflected back and forth between the mirrors. When the applied current is greater than a threshold current of the laser, the optical radiation in the laser cavity coherently oscillates to form a standing wave and, as a result, the laser emits coherent optical radiation. Usually the electrical current is applied through two electrodes, one located adjacent one mirror and the other adjacent the second mirror. Typically, one of these electrodes has some type of hole through which optical radiation may be emitted. In the VCSEL, radiation is emitted in a direction perpendicular to the plane of the substrate, rather than generally parallel to the substrate as in the case of a conventional edge emitting laser.

In the past, typical VCSELs have been manufactured in either a square or circular symmetrical configuration. As a consequence, emitted optical radiation tends to form circular beams which lack a preferred polarization. Essentially each VCSEL cavity has a slight anisotropic optical characteristic which can give a slight preference of polarization in one direction, thus causing the laser to emit a beam of polarized light in a preferred direction. When VCSELs are placed in an array, this tendency can lead to each of the emitted beams having a different polarization. Unfortunately, variations of polarization between different VCSELs within an array can lead to degraded performance which is unacceptable in certain environments, particularly in image scanning and recognition systems. Therefore arrays of VCSELs which have uniform directions of polarization within an entire array are needed.

It has heretofore been proposed by Jewel et al. in U.S. Pat. No. 5,331,654 to use the anisotropy in the atomic, molecular or electronic structure of the materials comprising the VCSEL, create anisotropic features through anisotropic patterning, deliver offset alignment of the features processing of the VCSEL or, finally, form anisotropic structures within the VCSEL, to control the polarization of the emitted beam. Unfortunately, manufacturing VCSELs in this fashion has proven extremely difficult. For example, fabricating an anisotropic structure by etching some type of grating into the semiconductor material is particularly difficult when the width of the etched lines are extremely small as is necessary for the emission of visible or near infra-red wavelengths.

Another solution for controlling the polarization of a vertical cavity surface emitting laser has been proposed by Swirhun et al. in U.S. Pat. No. 5,412,680. Essentially Swirhun et al. teaches that the polarization of a VCSEL laser can be controlled by having an active region containing at least one strained semiconductor layer which has a preferred direction of electrical conductivity due to the strain. In another embodiment the active region is formed in an elongated oval shape which also controls the direction of polarization. In the embodiment related to the increasing of strain in the active region, Swirhun has proposed to use alternating lasers of GaAs and $In_{0.2}Ga_{0.8}As$ layers. Unfortunately, since the wavelength of the emitted radiation is dependent on the thickness of the $In_{0.2}Ga_{0.8}As$, when this layer becomes too thick, discontinuities can arise in these layers due to the excessive strain imposed. In a second embodiment disclosed in the '680 patent in which the active regions are made of oblong shapes, serious costs become involved in trying to obtain the exacting dimensions required of the active region.

Based on the above, there exists a need in the art of VCSELs for an efficient and cost effective method of manufacturing an array of VCSELs whose emitted optical polarization can be easily controlled. In addition, there exists such a need for an attractively manufactured array wherein, all of the VCSELs within the array would have the same polarization of light. This would create an array of polarized laser light which could be used in various fields, particularly imaging and optical communications, that has not been achievable in a simple and economical manner before.

SUMMARY OF THE INVENTION

The present invention is directed to a vertical cavity surface emitting laser (VCSEL) and its method of manufacture. The VCSEL includes a standard laser cavity including a first mirror comprising a quarter wave stack of alternating layers of GaAs and AlAs which is doped either N-type or P-type so as to be highly conductive. Adjacent this first mirror layer is an active (lasing) medium comprising a multiple quantum well material which is designed with a certain operating wavelength in mind. Opposing the first mirror layer is a second mirror layer which also comprises a quarter wave stack of alternating layers of GaAs and AlAs that is doped opposite to the first mirror, either P-type or N-type. The result is an effectively sandwiched active medium having an intrinsic region of p-i-n heterostructure. The first mirror layer is eutectically bonded to a host substrate. The host substrate may be any material with an anisotropic coefficient of thermal expansion. Contact electrodes are mounted on the second mirror layer.

The VCSEL of the instant invention is preferably formed with the following method. First, a primary substrate layer is provided. Then an intermediate layer approximately (100 nm–200 nm) thick of AlAs is grown on top of the primary substrate. This layer provides an etch stop for total removal of the substrate. Next, a standard laser cavity of the structure above is formed with two mirror layers having an active layer sandwiched therebetween. Next the laser cavity is inverted and eutectically bonded to a host substrate having an anisotropic coefficient of thermal expansion, e.g., $LiTaO_3$ or $LiNbO_3$. The substrate material is then thinned down to 0.05 mm–0.1 mm by either mechanical or chemical lapping of the substrate. Next, the remaining 0.05 mm–0.1 mm of substrate material is chemically etched, i.e., the GaAs is selectively etched with respect to the AlAs stop layer. The AlAs etch stop layer is then removed with a buffered HF solution. Following removal of the etch stop layer, the laser cavity can be etched to define the lateral dimension of the VCSEL and top electrodes can be evaporated on the sample to make contact and apply bias.

Due to the fact that the laser cavity layer is eutectically bonded to the host substrate with an anisotropic coefficient of thermal expansion, the layer will have a uniaxial strain induced therein. The uniaxial strain actually constitutes an anisotropic, in-plane strain which breaks the rotational symmetry of the valence band at k=0, thereby mixing the heavy and light hole bands in the multiple quantum well at a zone center. This results in an anisotropy in the optical gain associated with the active region, thereby causing the emission from the VCSEL to be linearly polarized along the direction of which the maximum optical gain is obtained. It is important to note that this invention functions despite the fact that the laser cavity structure preserves the crystal orientation and symmetry of the original primary substrate. With the application of this invention in the manufacture of VCSEL's, it becomes possible to control the output polarization of larger arrays. Since the output polarization is controlled by the anisotropic stress associated with the host substrate, the polarization orientation is thus dependent on the particular host material which is no longer arbitrary.

Additional features and advantages of the vertical cavity surface emitting laser and its method of manufacture in accordance with the present invention will become more readily apparent from the following detailed description of the preferred embodiment thereof when taken in conjunction with the drawings wherein like reference numerals refer to corresponding parts in the several views.

DETAILED DESCRIPTION OF THE PREFERRED EMBODIMENT

Figure 1:
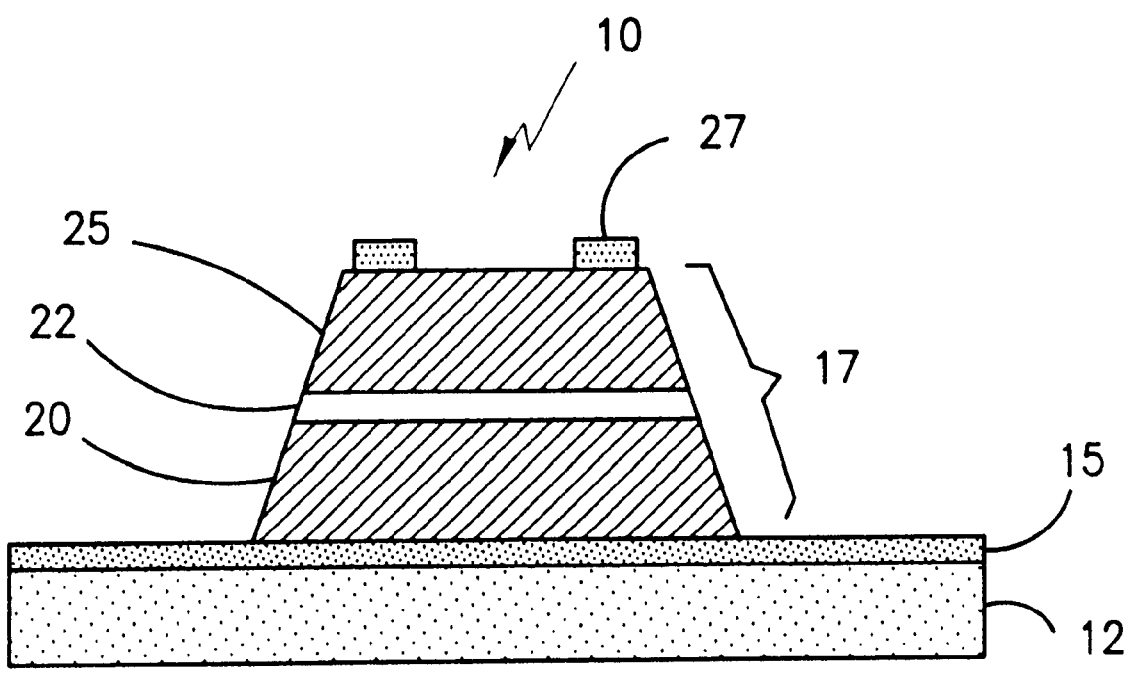
FIG. 1 is a cross-sectional view of a VCSEL bonded to a host substrate having an anisotropic coefficient of thermal expansion according to a preferred embodiment of the invention.

Referring initially to FIG. 1, there is shown a cross-sectional view of a vertical-cavity, surface-emitting laser (VCSEL) 10 in accordance with the preferred embodiment of the present invention. The VCSEL 10 comprises a host substrate 12 made of any material with an anisotropic coefficient of thermal expansion. Preferably the host substrate will be made of Li/Ta/$O_3$ or Li/Nb/$O_3$. On one side of the host substrate 12, a eutectic bonding layer 15 is provided which bonds a laser cavity 17 to the substrate 12. Laser cavity 17 comprises three basic elements including, a first mirror 20 attached to the eutectic bonding layer 15, a middle or active layer 22 and a second mirror 25. As shown, second mirror 25 is arranged parallel to first mirror 20, with the active layer 22 being sandwiched therebetween. The first mirror 20 is preferably a Bragg reflector formed with alternating layers of high and low indices of refractive semiconductor materials which are electrically conductive. Preferably these layers are constituted by GaAs and AlAs and are approximately ¼ wavelength thick. In accordance with the invention, first mirror 20 obtains greater than 99% reflectivity and is doped either N-type or P-type so as to be highly conductive.

Placed adjacent first mirror 20, as mentioned above, is active layer 22. This active layer 22 comprises a multiple quantum well material, the characteristics of which depends on the operating wavelength in mind. Active layer 22 preferably includes at least one quantum well formed by having a first semi-conductor layer sandwiched between second and third semiconductor layers, wherein the second and third semiconductor layers have greater energy band gaps than the first semiconductor layer. Additional quantum wells may be introduced into active layer 22 by adding additional layers in a manner known in the art.

Adjacent active layer 22 there is arranged a second mirror 25. Similar to first mirror 20, second mirror 25 preferably constitutes a Bragg reflector formed with alternating layers of high and low refractive semiconductor materials which are electrically conductive. In addition, second mirror 25 is preferably made of alternating layers of GaAs and AlAs that are approximately ¼ wavelength thick. While this mirror must also have a high reflectivity, it need not be as reflective as first mirror 20 to allow the proper emission of optical radiation as will be more fully discussed below. To be highly conductive, second mirror 25 is doped with either N-type or P-type dopants in a manner similar to first mirror 20. However, it is important to note that the second mirror 25 is doped opposite to first mirror 20. This arrangement effectively sandwiches active layer 22 in an intrinsic region of a p-i-n heterostructure. Finally, electrical contacts 27 are located on top of second mirror 25.

Figure 2:
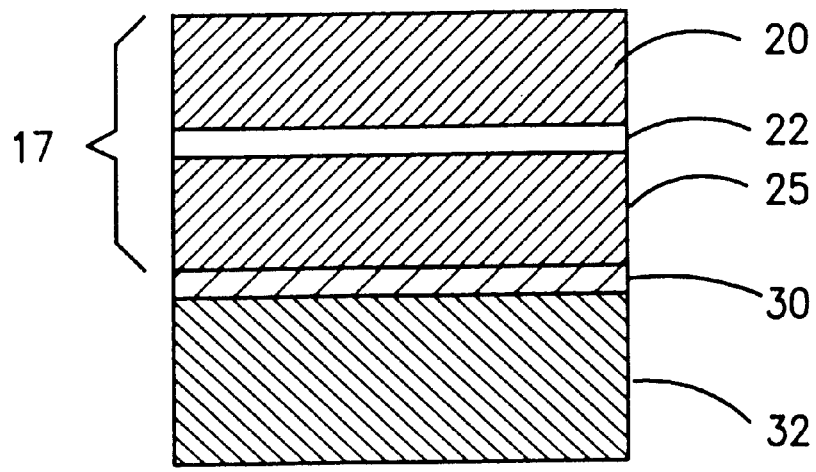
FIG. 2 is a cross-sectional view of the VCSEL according to the invention in an initial stage of manufacture.

Now turning to FIGS. 2–6, an explanation of how the VCSEL 10 is preferably manufactured will be provided. FIG. 2 depicts a cross-section of VCSEL 10 during its initial stage of manufacture wherein there is provided a substrate 32, preferably formed of GaAs. This substrate 32 is doped, for example, N-type with silicon. An etch stop layer 30 is grown atop substrate layer 32, followed by the growth of laser cavity 17. Etch stop layer 30 is preferably 100–200 nm thick and is made from AlAs. As will be described more fully below, layer 30 will provide an etch stop during the removal of substrate 32. On top of etch stop layer 30 is grown second mirror 25. Second mirror 25 can be epitaxially grown by metal-organic chemical vapor deposition (MOCVD), molecular beam epitaxy (MBE) or any other similar method known in the art. As mentioned above, second mirror 25 is doped with the same polarity as substrate 32 and comprises a plurality of alternating layers of GaAs and AlAs having high and low indices of refraction. Atop second mirror 25 is grown the active layer 22. Finally, first mirror 20 is epitaxially grown on active region 22. Again first mirror 20 is also comprised of alternating layers of GaAs and AlAs, with each alternating layer having high and low indices of refraction and the entire first mirror 20 being doped either N-type or P-type. Most importantly, first mirror 20 is doped to have an opposing polarity to the stack of second mirror 25.

Figure 3:
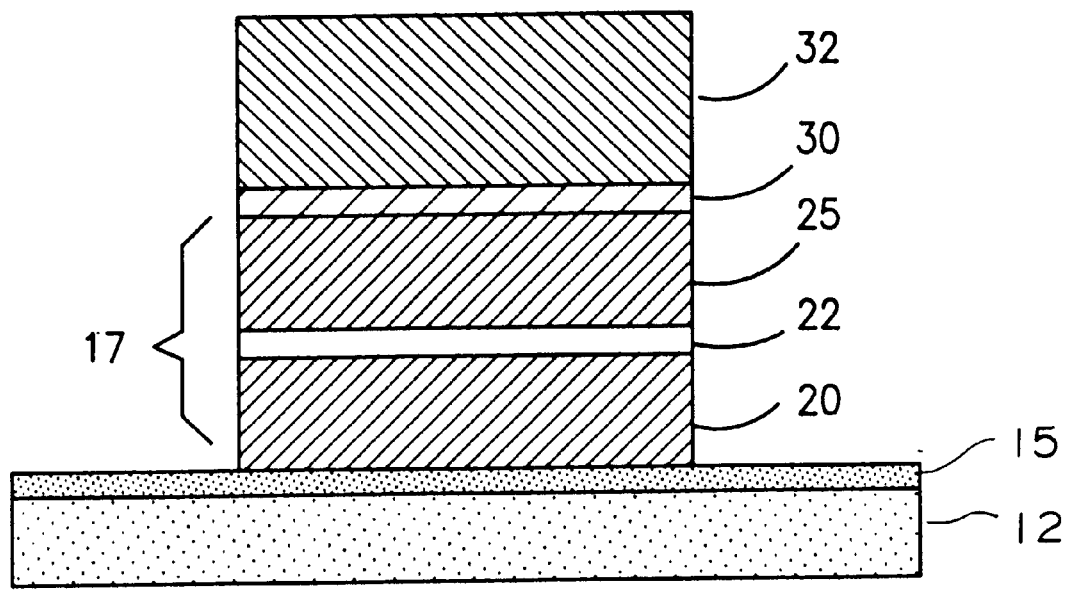
FIG. 3 illustrates a cross-sectional view of the VCSEL of the invention in a second stage of manufacture.

In FIG. 3 the second stage of construction of VCSEL 10 is shown. Actually, the assembly shown in FIG. 2 has been inverted and eutectically bonded to host substrate 12. The bonding layer 15 provides adhesion between the laser cavity 17 and the host substrate 12.

Figure 4:
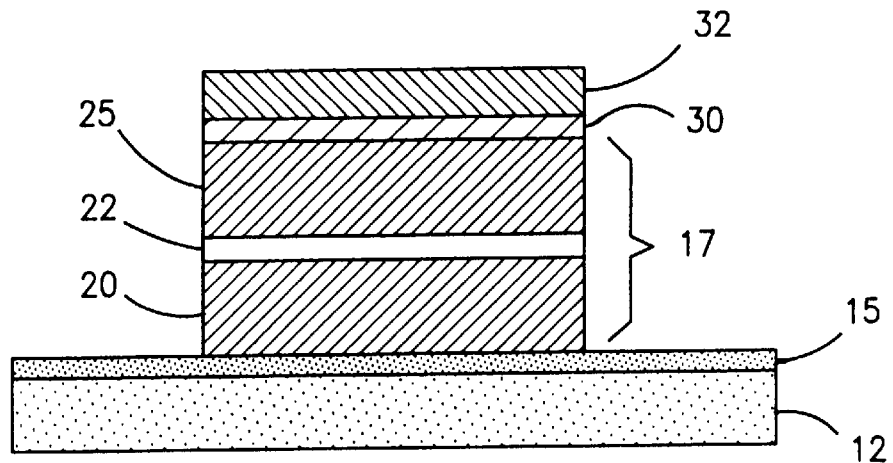
FIG. 4 is a cross-sectional view of the VCSEL of the invention in the third stage of manufacture.

FIG. 4 shows the laser assembly in its third stage of manufacture during which the substrate layer 32 is thinned down to between 0.05 mm and 0.1 mm by either a mechanical or chemical lapping of the substrate layer 32. In either case, a smooth surface is preferably provided on the remaining substrate 32 so that subsequent chemical processing can be simplified.

Figure 5:
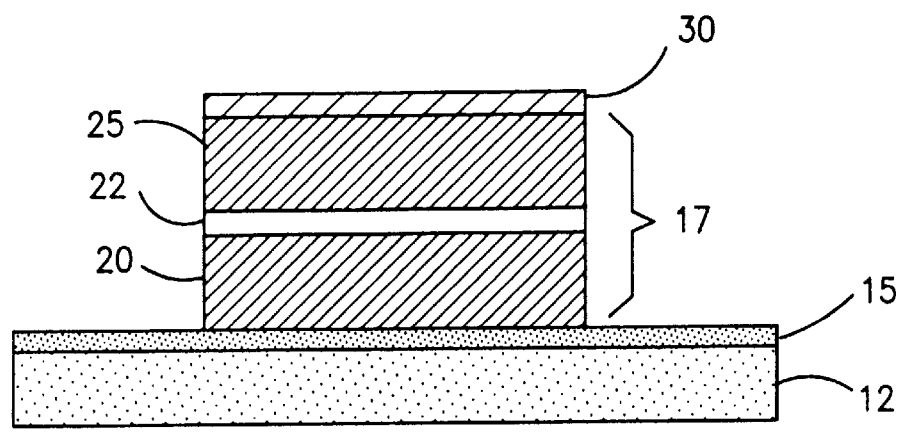
FIG. 5 is a cross-sectional view of the VCSEL of the invention shown in a fourth stage of manufacture.

FIG. 5 shows the laser assembly in a fifth stage of manufacture in which the remaining 0.05 mm to 0.1 mm thickness of substrate layer 32 is chemically etched, i.e., the GaAs is selectively etched with respect to the AlAs stop layer 30.

Figure 6:
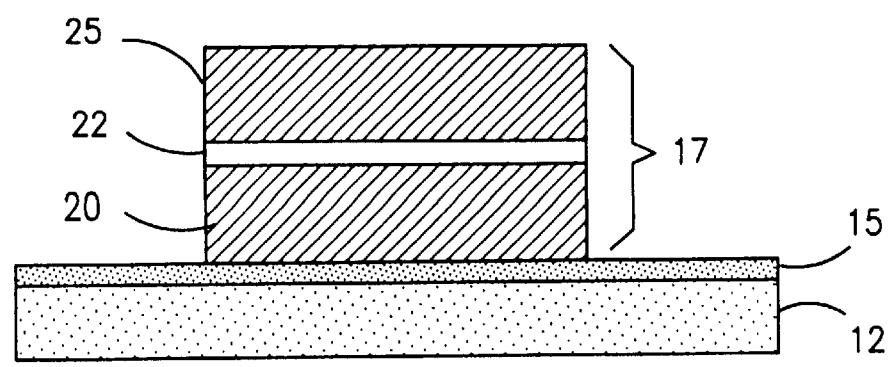
FIG. 6 is a cross-sectional view of the VCSEL of the invention shown in a subsequent stage of manufacture.

As shown in FIG. 6, during a subsequent stage of manufacture of VCSEL 10, the etch stop layer 30 is removed in a buffer solution, such as HF. It should be noted that this is a selective etching process such that etch stop layer 30 is removed while leaving the laser cavity 17 alone.

Finally, referring back to FIG. 1, following removal of the etched stop layer 30, the laser cavity 17 is then processed using the same processing steps as is known in the art for a typical semiconductor device. For example, the VCSEL 10 can be mesa etched to define the lateral dimensions thereof and to form the sloped edges shown in FIG. 1. Further electrodes 27 can be evaporated onto VCSEL 10 to make contact and apply bias to VCSEL 10. The details of these manufacturing steps are well known in the art and therefore will not be discussed in detail here.

To operate VCSEL 10, potential difference is applied between electrode 27 and host substrate 12 in order to cause a current to traverse laser cavity 17. As charge carriers, either P-type or N-type, move from the respective mirrors 20 and 25 into active layer 22, the charge carriers combine to generate light which is then reflected back and forth between first mirror 20 and second mirror 25. As the light is reflected back and forth, it increases to establish a standing wave. Eventually, a beam of light is emitted from second mirror 25, with the beam of light being perpendicular to the plane of substrate 12. Due to the fact that laser cavity 17 is eutectically bonded to host substrate 12 which has with an anisotropic coefficient of thermal expansion, laser cavity 17 will have a uniaxial or anisotropic, in-plane strain induced therein. The uniaxial strain breaks the rotational symmetry of the valance band at F=0 thereby mixing the heavy and light hole bonds in the multiple quantum well at the zone center. This results in anisotropy in the optical gain in the active layer 22, thereby causing the emission of VCSEL 10 to be linearly polarized along a direction of maximum optical gain.

It is important to note that VCSEL 10 of the present invention will function to control polarization despite the fact that the structure laser cavity 17 preserves the crystal orientation of symmetry of the original substrate layer 32. In addition, it should be clear that, with application of this method of manufacturing VCSELs, it is possible to control the polarization of large arrays. Since the output polarization is controlled by the anisotropic stress due to the host substrate 12, the polarization orientation is thus dependent on the material of host substrate 12, which is no longer arbitrary. Instead, VCSEL 10 can be made with a preset output polarization determined by the anisotropic host substrate.

Although described with respect to the preferred embodiment of the invention, it should be readily understood that various changes and/or modifications can be made in the invention without departing from the spirit thereof In general, the invention is only intended to be limited by the scope of the following claims.

We claim:

1. A vertical cavity surface emitting laser comprising:
   a substrate having a predetermined anisotropic coefficient of thermal expansion; and
   a laser cavity including a first mirror, a second mirror and an active layer disposed between said first and second mirrors, said laser cavity being eutectically bonded to said substrate with an induced uniaxial strain, wherein light formed by the laser cavity is linearly polarized.

2. The vertical cavity surface emitting laser according to claim 1, wherein said substrate is formed of LiNbO$_3$.

3. The vertical-cavity surface emitting laser according to claim 1, wherein said substrate is formed of LiTaO$_3$.

4. The vertical cavity surface emitting laser according to claim 1, wherein said first mirror includes a stack of alternating layers of GaAs and AlAs.

5. The vertical cavity surface emitting laser according to claim 4, wherein said second mirror includes a stack of alternating layers of GaAs and AlAs.

6. The vertical cavity surface emitting laser according to claim 5, wherein each of the first and second mirrors are doped, with one of the first and second mirrors being doped N-type and another of the first and second mirrors being doped P-type.

7. The vertical cavity surface emitting laser according to claim 1, wherein said active layer is formed of a multiple quantum well material.

8. A method of producing a vertical cavity surface emitting laser having a calculated output polarization comprising:
   forming a laser cavity assembly by sandwiching an active layer between first and second mirror layers; and
   bonding said laser cavity assembly to a host substrate formed of a material having a predetermined anisotropic coefficient of thermal expansion.

9. The method according to claim 8, further comprising: eutectically bonding the laser cavity assembly to the host substrate.

10. The method according to claim 8, further comprising: forming the host substrate of LiNbO$_3$.

11. The method according to claim 8, further comprising: forming the host substrate of LiTaO$_3$.

12. A method of producing a vertical cavity surface emitting laser comprising:
   providing a substrate layer;
   expitaxially growing an etch stop layer on said substrate layer;
   expitaxially growing a first quarter wave stack mirror of alternating layers of high and low refractive materials on said etch stop layer;
   expitaxially growing an active layer, formed from a multiple quantum well material, on said first quarter wave stack mirror;
   growing a second quarter wave stack mirror of alternating layers of high and low refractive materials on said active layer to form an intermediate assembly;
   eutectically bonding said intermediate assembly to a host substrate formed of a material having an anisotropic coefficient of thermal expansion;
   thinning down said substrate layer to within a desired thickness range;
   chemically etching said substrate layer;
   removing said etch stop layer; and
   securing electrodes to the intermediate assembly.

13. The method according to claim 12, further comprising: growing the etch stop layer on said substrate layer to a thickness in the range of 100 nm–200 nm.

14. The method according to claim 12, further comprising: thinning down the substrate layer to within 0.05 mm to 0.1 mm.

15. The method according to claim 12, further comprising: forming the substrate layer of GaAs and forming the etch stop layer of AlAs.

16. The method according to claim 15, further comprising: chemically etching the substrate layer relative to the etch stop layer by selectively etching the GaAs with respect to the AlAs.

17. The method according to claim 16, further comprising: removing said etch stop layer with a buffered HF solution which has a demonstrated selectivity of etching AlAs with respect to GaAs.

* * * * *